(12) United States Patent
Hwang et al.

(10) Patent No.: US 9,820,378 B2
(45) Date of Patent: Nov. 14, 2017

(54) PRINTED CIRCUIT BOARD AND METHOD OF MANUFACTURING THE SAME

(71) Applicant: LG INNOTEK CO., LTD., Seoul (KR)

(72) Inventors: Jung Ho Hwang, Seoul (KR); Han Su Lee, Seoul (KR); Dae Young Choi, Seoul (KR); Soon Gyu Kwon, Seoul (KR); Dong Hun Jeong, Seoul (KR); In Ho Jeong, Seoul (KR); Kil Dong Son, Seoul (KR); Sang Hwa Kim, Seoul (KR); Sang Young Lee, Seoul (KR); Jae Hoon Jeon, Seoul (KR); Jin Hak Lee, Seoul (KR); Yun Mi Bae, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/241,714

(22) Filed: Aug. 19, 2016

(65) Prior Publication Data

US 2017/0055347 A1    Feb. 23, 2017

(30) Foreign Application Priority Data

Aug. 19, 2015  (KR) .................. 10-2015-0116680

(51) Int. Cl.
*H05K 1/09*  (2006.01)
*H05K 1/02*  (2006.01)
(Continued)

(52) U.S. Cl.
CPC ............. *H05K 1/0298* (2013.01); *H05K 1/09* (2013.01); *H05K 3/108* (2013.01); *H05K 3/244* (2013.01);
(Continued)

(58) Field of Classification Search
CPC .......... H05K 3/243; H05K 3/244; H05K 3/24; H05K 2201/098; H05K 2203/1184
See application file for complete search history.

(56) References Cited

U.S. PATENT DOCUMENTS 5,134,460 A * 7/1992 Brady ..................... H01L 24/10
                                                        257/733
5,904,863 A * 5/1999 Hatfield ................. C03C 15/00
                                                        216/105
(Continued)

FOREIGN PATENT DOCUMENTS

DE    102008020924 A1    11/2009
JP         2006196656 A     7/2006
(Continued)

OTHER PUBLICATIONS

Office Action dated Sep. 1, 2016 in Korean Application No. 1020160049000.

(Continued)

*Primary Examiner* — Steven T Sawyer
(74) *Attorney, Agent, or Firm* — Saliwanchik, Lloyd & Eisenschenk

(57) ABSTRACT

Disclosed are a printed circuit board and a method of manufacturing the printed circuit board. The printed circuit board includes an insulating layer, and a circuit pattern formed on the insulating layer, wherein the circuit pattern includes a first circuit pattern formed on the insulating layer and including a corner portion of an upper portion which has a predetermined curvature and a second circuit pattern formed on the first circuit pattern and configured to cover an upper surface of the first circuit pattern including the corner portion.

15 Claims, 9 Drawing Sheets

(51) Int. Cl.
*H05K 3/10* (2006.01)
*H05K 3/24* (2006.01)
(52) U.S. Cl.
CPC ........... *H05K 2201/0347* (2013.01); *H05K 2201/098* (2013.01); *H05K 2203/0588* (2013.01); *H05K 2203/1184* (2013.01)

(56) References Cited

U.S. PATENT DOCUMENTS

| | | | |
|---|---|---|---|
| 6,199,757 | B1 | 3/2001 | Kubert |
| 2003/0127743 | A1* | 7/2003 | Brintzinger ............ H01L 21/288 257/762 |
| 2006/0199394 | A1 | 9/2006 | Takahashi et al. |
| 2006/0204650 | A1 | 9/2006 | Hu |
| 2007/0069347 | A1* | 3/2007 | Lin ..................... H01L 23/3192 257/673 |
| 2007/0111401 | A1* | 5/2007 | Kataoka ................... H05K 3/06 438/128 |
| 2008/0308307 | A1 | 12/2008 | Chang et al. |
| 2010/0263921 | A1 | 10/2010 | Nakahara et al. |
| 2012/0006591 | A1 | 1/2012 | Kaneko et al. |
| 2012/0125668 | A1* | 5/2012 | Chang ................. H01L 21/4853 174/257 |
| 2013/0161085 | A1* | 6/2013 | Oh ........................ H01L 24/11 174/267 |
| 2014/0061920 | A1* | 3/2014 | Hirano ............. H01L 23/53238 257/751 |

FOREIGN PATENT DOCUMENTS

| | | |
|---|---|---|
| JP | 2012019080 A | 1/2012 |
| KR | 20060036064 A | 4/2006 |
| KR | 20100029561 A | 3/2010 |
| KR | 20120115034 A | 10/2012 |
| TW | 200633609 A | 9/2006 |
| TW | 200934346 A | 8/2009 |
| WO | WO-2010140725 A1 | 12/2010 |

OTHER PUBLICATIONS

Office Action dated Feb. 13, 2017 in Taiwanese Application No. 105125760.
European Search Report dated Feb. 16, 2017 in European Application No. 16183691.1.

* cited by examiner

PRINTED CIRCUIT BOARD AND METHOD OF MANUFACTURING THE SAME

CROSS-REFERENCE TO RELATED APPLICATIONS

This present application claims priority under 35 U.S.C. §119 to Korean Patent Application No. 10-2015-0116680, filed Aug. 19, 2015, which is herein incorporated by reference in its entirety.

BACKGROUND

The embodiment relates to a printed circuit board (PCB), and more particularly, a PCB including a first circuit pattern of which an upper portion has a curvature, a circuit pattern having a second circuit pattern formed on the first circuit pattern, and a top metal layer formed on the circuit pattern by electroplating and a method of manufacturing the same.

As the PCB is formed by printing a circuit line pattern on an electrical insulating board with a conductive material such as copper, the PCB is referred to as aboard just before electronic components are mounted thereon. That is, in order to mount various types of electronic components on the planar surface, the PCB refers to a circuit board having a planar surface on which a mounting position of each component is fixed and a circuit pattern connecting the components is fixedly printed.

Generally, a surface processing method for a circuit pattern included in the above-described PCB uses an organic solderability preservative (OSP) method, an electro nickel/gold method, an electro nickel/gold-cobalt alloy method, an electroless nickel/palladium/gold method, etc.

Here, the above-described surface processing methods is selected based on the purpose of operation, for example, a use for soldering, a use for wire bonding, a use as connectors, etc.

FIG. 1 shows cross-sectional views of a process sequence for describing a method of manufacturing a PCB according to a conventional art, and FIG. 2 is a view illustrating an upper surface of the PCB according to the conventional art.

Referring to FIG. 1A, first, an insulating layer 10 is provided, and a seed layer 20 is formed on the provided insulating layer 10.

Further, a mask 30 including an opening (not shown) which exposes at least a part of an upper surface of the seed layer 20 is formed on the formed seed layer 20.

Then, electroplating is performed based on the seed layer 20, and a circuit pattern 40 under which the opening of the mask 30 is buried is formed on the seed layer 20.

Then, referring to FIG. 1B, when the circuit pattern 40 is formed, a grinding process for planarization of an upper surface of the formed circuit pattern 40 is performed.

While performing the grinding process, at least a part of the upper portion of the circuit pattern 40 spreads inside of the mask 30, and thus, an upper end portion of the circuit pattern 40 includes a protrusion (not shown) protruding in a direction of the mask 30.

Then, referring to FIG. 1C, a preprocessing process for performing a surface processing process is performed.

Here, the preprocessing process is performed using an acid-based chemical for etching a surface of the circuit pattern 40. At this point, when the preprocessing process is performed, the etching is performed not only on the upper surface of the circuit pattern 40 but also on boundary surfaces of upper and side surfaces of the circuit pattern 40.

Thus, when the preprocessing process is performed, each corner portion 50 of the circuit pattern 40 has a predetermined curvature in a convex shape.

In other words, when the preprocessing process is performed, gaps are generated between the mask 30 and the circuit pattern 40.

Further, in the conventional art, with the gaps generated as shown in FIG. 2, a surface processing process is performed on the circuit pattern 40 to form a top metal layer 60.

However, when the top metal layer 60 is formed with the gaps generated, the top metal layer 60 is also formed on the corner portions 50 of the circuit pattern 40.

Accordingly, as shown in FIG. 2, the top metal layer 60 according to the conventional art may include a protrusion 70 protruding in a direction of a side surface of the circuit pattern 40, and this makes a big impact on the reliability of the PCB.

BRIEF SUMMARY

The embodiment provides a printed circuit board (PCB) having a new structure and a method of manufacturing the same.

In addition, the embodiment provides a PCB formed by electroplating a top metal layer of a circuit pattern using a plating seed layer used in the formation of the circuit pattern and a method of manufacturing the same.

Further, the embodiment provides a PCB including a first circuit pattern of which at least a part of a corner portion has a curved surface and a circuit pattern including a second circuit pattern which is formed on the first circuit pattern and covers a corner portion of the curved surface, and a method of manufacturing the same.

Furthermore, the embodiment provides a PCB including a top metal layer formed on the second circuit pattern, having a width greater than a width of the second circuit pattern, and configured to protrude from a side surface of the second circuit pattern to the outside, and a method of manufacturing the same.

The objectives of the present invention are not limited to the above, and other objectives will be clearly understood to those skilled in the art from the following descriptions.

According to the embodiment, there is provided a PCB including an insulating layer; a plating seed layer disposed on the insulating layer; a circuit pattern disposed on the plating seed layer; and a top metal layer disposed on the circuit pattern, wherein the circuit pattern comprises: a first circuit pattern disposed on the plating seed layer, and a second circuit pattern disposed on the first circuit pattern and including a same metallic material as the first circuit pattern.

According to the embodiment, there is provided a PCB including an insulating layer; a plating seed layer disposed on the insulating layer; a first circuit pattern disposed on the plating seed layer and directly contacted with the plating seed layer; a second circuit pattern directly contacted with the first circuit pattern and formed of copper; and a top metal layer directly contacted with the second circuit pattern and formed of gold (Au), wherein the top metal layer has a wider width than a width of the second circuit pattern.

According to the embodiment of the present invention, a flash plating process is performed to fill corner portions of a circuit pattern etched during a preprocessing process, then a surface processing process is performed with the corner portions filled, and thus a failure of the top metal layer due to overspreading can be removed, thereby the reliability of a PCB can be improved.

In addition, according to the embodiment of the present invention, since a top metal layer is formed by utilizing a plating seed layer used in the formation of a circuit pattern, one of electrolytic surface processing and electroless surface processing methods is selectable without a design restriction.

Further, according to the embodiment of the present invention, since a top metal layer including gold (Au) is formed using the plating seed layer used in the formation of the circuit pattern, a nickel (Ni) top metal layer serving as a seed layer function of a conventional gold (Au) top metal layer can be removed, and thus a thickness of a product can be lowered, and product cost can also be lowered due to the removal of the nickel top metal layer.

Furthermore, according to the embodiment of the present invention, since a portion, protruding from a side surface of the circuit pattern to the outside, of the top metal layer is minimized by performing the flash plating process, the structural stability of the top metal layer can be secured.

Further, according to the embodiment of the present invention, a problem of cracks occurring between a Cu layer which forms a circuit pattern and an Au layer which is a surface processing layer of the circuit pattern can be solved, delamination of each layer and occurrence of voids caused by the cracks can then be suppressed, and reliability of a printed circuit board can thus be improved.

The details of one or more embodiments are set forth in the accompanying drawings and the description below. Other features will be apparent from the description and drawings, and from the claims.

DETAILED DESCRIPTION

Figure 1A:
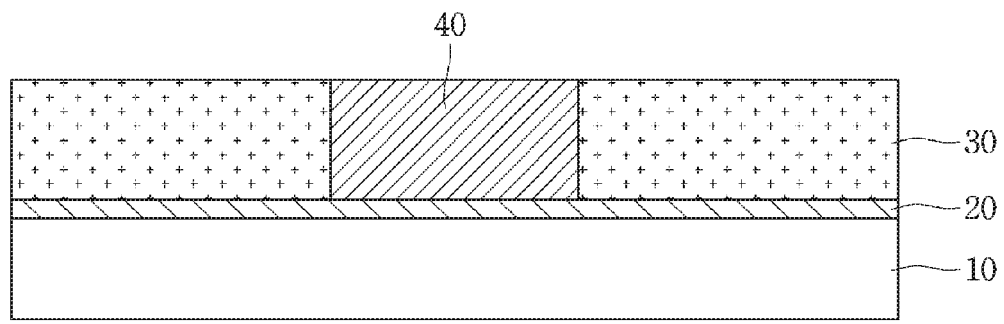
FIGS. 1A, 1B, and 1C show cross-sectional views of a process sequence for describing a method of manufacturing a printed circuit board (PCB) according to a conventional art.
Figure 1B:
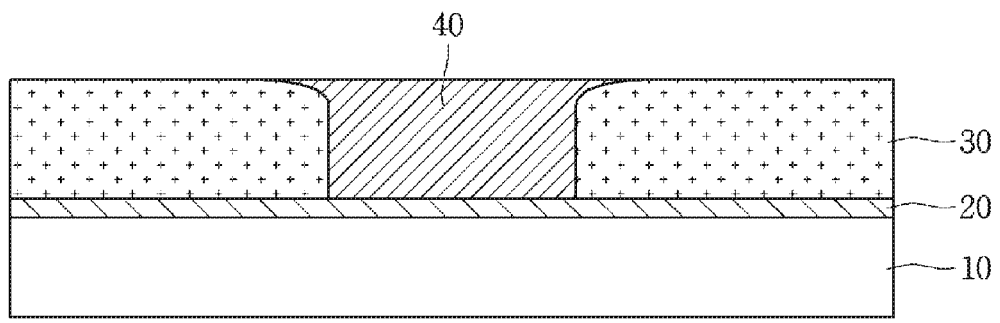
Figure 1C:
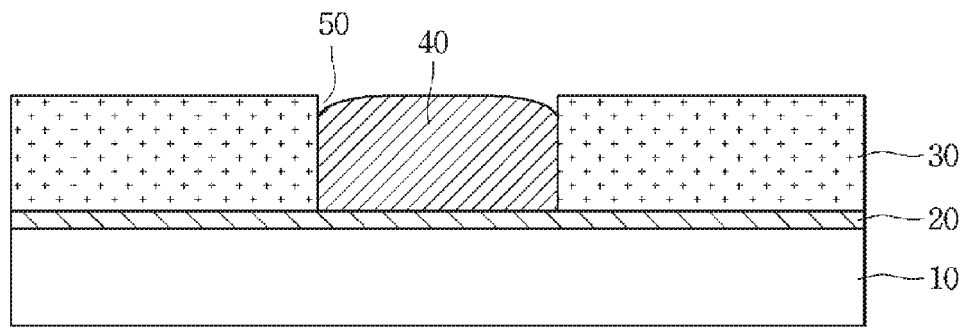
Figure 2:
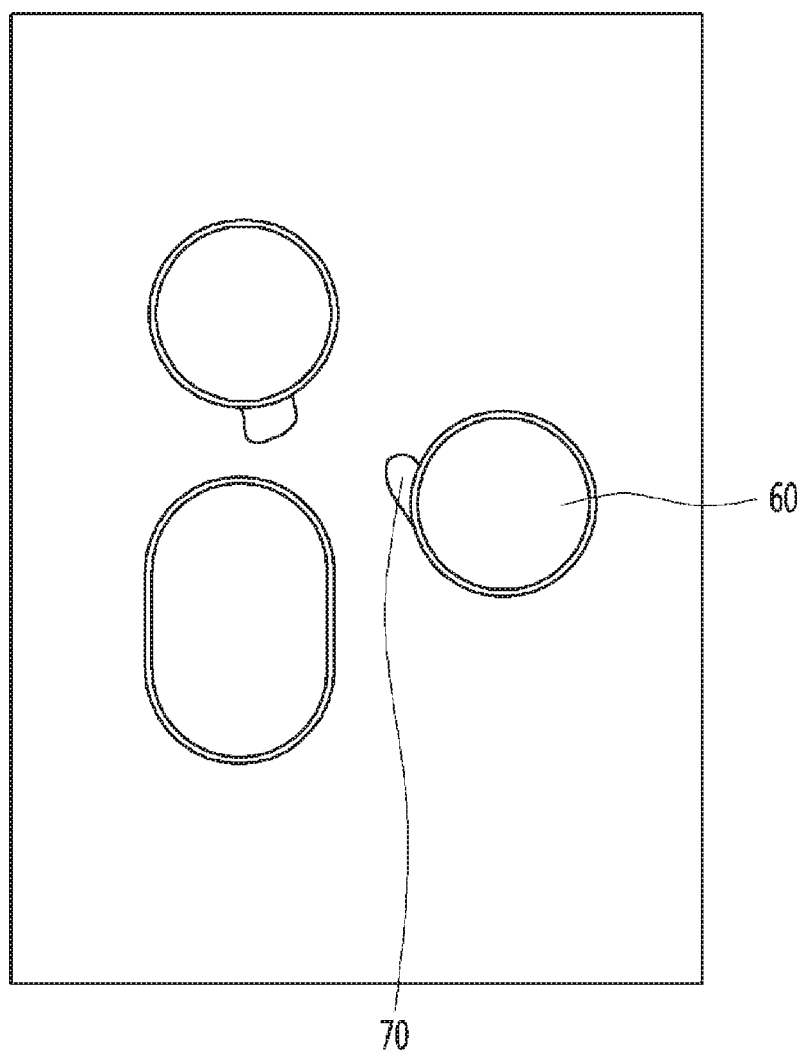
FIG. 2 is a view illustrating an upper surface of the PCB according to the conventional art.

Hereinafter, exemplary embodiments of the present invention that are easily performed by those skilled in the art will be described in detail with reference to the accompanying drawings. However, the present invention may be implemented in various different forms and is not limited to the embodiments described herein.

In the following description, when there is an expression that some portion "includes" some structural elements, this means that some portion does not exclude another structural element, but may further include another structural element unless stated to the contrary.

Further, structures and elements which do not relate to the detail description are not shown in the drawings to clearly describe the present invention, thicknesses may be exaggerated to clearly explain various layers and regions, and similar elements in the following description are designated by similar reference numerals.

It will be understood that when a portion of a layer, a film, a region, a plate or the like is referred to as being "on" another portion, it can be "directly formed on" another portion, or a third portion can be interposed between the portions. Otherwise, when a portion is "directly formed on" another portion, it means that there is no third portion between the portions.

The embodiment of the present invention provides a new printed circuit board (PCB) on which a surface processing process may be performed after filling corner portions, etched by a preprocessing process, of a circuit pattern based on a flash process and a method of manufacturing the same.

Figure 3:
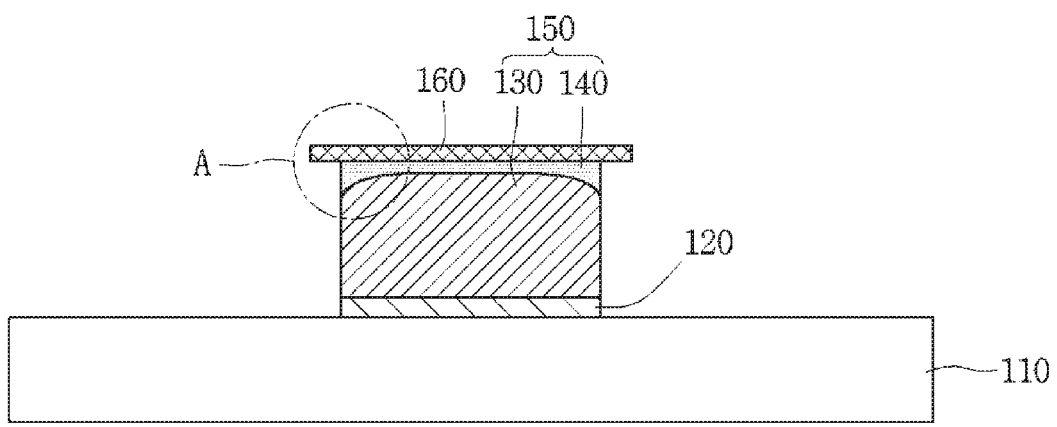
FIG. 3 is a cross-sectional view illustrating a structure of a PCB according to an embodiment of the present invention.
Figure 4:
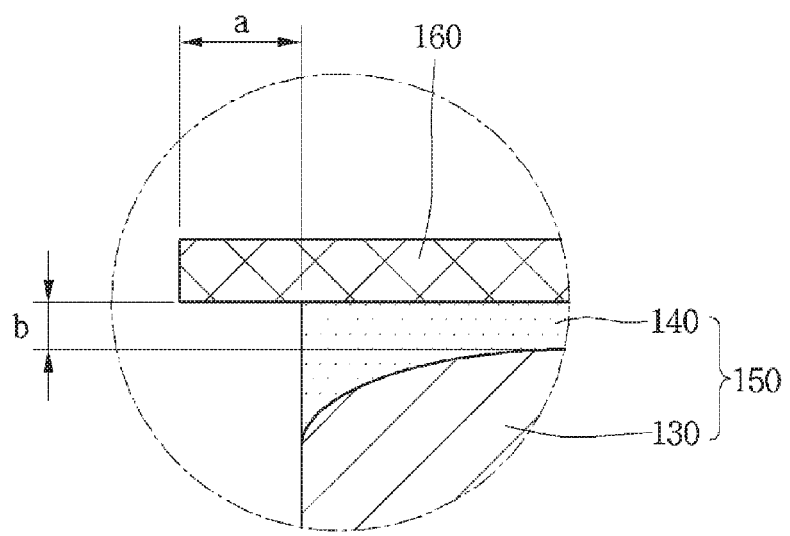
FIG. 4 is an enlarged view of a portion A shown in FIG. 3.

FIG. 3 is a cross-sectional view illustrating a structure of a PCB according to an embodiment of the present invention, and FIG. 4 is an enlarged view of a portion A shown in FIG. 3.

Referring to FIGS. 3 and 4, a PCB 100 includes an insulating layer 110, a plating seed layer 120, a circuit pattern 150, and a top metal layer 160.

The insulating layer 110 may be a support board of a PCB on which a single circuit pattern is formed or may be an insulating layer region, in which the circuit pattern 150 is formed, of a PCB having a stacked multilayer structure.

When the insulating layer 110 refers to an insulating layer included in the stacked multilayer structure, a plurality of circuit patterns may be consecutively formed on an upper surface or lower surface of the insulating layer 110.

The insulating layer 110 may form an insulating plate, may be a thermosetting or thermoplastic polymer board, a ceramic board, an organic-inorganic composition material board, or a fiberglass immersion board, and when a polymer resin is included, an epoxy-based insulating resin may be included, otherwise, a polyimide-based resin may also be included.

The circuit pattern 150 is formed on the insulating layer 110.

Preferably, the plating seed layer 120 used in the formation of the circuit pattern 150 is formed between the insulating layer 110 and the circuit pattern 150.

Widths of upper and lower surfaces of the plating seed layer 120 may be the same. Here, the width may refer to an actual length.

In other words, a width of the upper surface of the plating seed layer 120 refers to an actual length from one end of the upper surface of the plating seed layer 120 to the other end, and a width of the lower surface of the plating seed layer 120 refers to an actual length from one end of the lower surface of the plating seed layer 120 to the other end. Accordingly, a width described below may be defined as an actual length from one end to the other end as in the above.

Further, the circuit pattern 150 is formed on the plating seed layer 120.

The circuit pattern 150 may also have a shape in which widths of upper and lower surfaces thereof are the same similarly to those of the plating seed layer 120.

The plating seed layer 120 and the circuit pattern 150 are formed of pure copper or a conductive metal material having copper (Cu).

The circuit pattern 150 may be formed by a general process of manufacturing a PCB, such as an additive process, a subtractive process, a modified semi additive process (MSAP), a semi additive process (SAP), etc., and detailed descriptions thereof will be omitted herein.

At this point, the circuit pattern 150 includes a first circuit pattern 130 of which corner portions of an upper portion have a predetermined curvature and a second circuit pattern 140 which is formed on the first circuit pattern 130 and covers the corner portions of the first circuit pattern 130.

That is, the circuit pattern 150 includes the first circuit pattern 130 in which boundary portions of upper and side surfaces thereof have convexly curved surfaces by having the corner portions removed during a preprocessing process.

Further, the second circuit pattern 140 is disposed on the first circuit pattern 130.

The second circuit pattern 140 is formed to cover the convexly curved surfaces of the first circuit pattern 130. In other words, the second circuit pattern 140 fills the corner portions of the first circuit pattern 130 removed during the preprocessing process.

An upper surface of the second circuit pattern 140 may be planar, and a lower surface thereof may have a curvature corresponding to a curvature of the corner portion of the first circuit pattern 130.

At least a part of a lower end of the second circuit pattern 140 is positioned at a lower level than an upper end of the first circuit pattern 130.

That is, the second circuit pattern 140 is formed to cover the corner portions of the first circuit pattern 130, and the corner portions are boundary surfaces of the upper and side surfaces of the first circuit pattern 130. In other words, the corner portions of the first circuit pattern 130 include a part of the upper surface and a part of the side surface of the first circuit pattern 130.

Accordingly, the second circuit pattern 140 is formed to substantially cover a part of the upper and side surfaces of the first circuit pattern 130.

Thus, a part of the lower end of the second circuit pattern 140 extends up to a side surface portion of the first circuit pattern 130 and is thus positioned at a lower level than the upper end of the first circuit pattern 130.

The top metal layer 160 is formed on the circuit pattern 150.

The top metal layer 160 may be formed of a metal including only gold (Au) or may be formed of an alloy including gold (Au).

When the top metal layer 160 is formed of the alloy including gold (Au), the top metal layer 160 may be formed of a gold alloy including cobalt. At this point, the top metal layer 160 is formed by electroplating.

Preferably, the top metal layer 160 is formed by electroplating on the plating seed layer 120 which is the same layer as the plating seed layer used in the formation of the circuit pattern 150.

The top metal layer 160 is formed on the circuit pattern 150, and thus a lower surface of the top metal layer 160 is in direct contact with an upper surface of the circuit pattern 150. More specifically, the lower surface of the top metal layer 160 is in direct contact with an upper surface of the second circuit pattern 140 of the circuit pattern 150.

At this point, the top metal layer 160 includes a lower surface having a width greater than a width of the upper surface of the circuit pattern 150.

Accordingly, the lower surface of the top metal layer 160 includes a first lower surface in direct contact with the upper surface of the circuit pattern 150 and a second lower surface not in contact with the upper surface of the circuit pattern 150.

Here, the first lower surface of the top metal layer 160 may be a central region of the lower surface of the top metal layer 160, and the second lower surface of the top metal layer 160 may be left and right regions of the top metal layer 160.

Further, the top metal layer 160 may have a shape in which widths of upper and lower surfaces thereof are the same.

Meanwhile, the upper and lower surfaces of the top metal layer 160 may have widths greater than the width of the lower surface of the circuit pattern 150.

Accordingly, as shown in FIGS. 3 and 4, the top metal layer 160 includes a protrusion protruding from the upper portion of the circuit pattern 150 to the outside of the side surface of the circuit pattern 150. The protrusion is a portion corresponding to the second lower surface of the top metal layer 160.

As described above, since the top metal layer 160 including gold (Au) is formed using the plating seed layer 120 used in the formation of the circuit pattern 150 according to the embodiment of the present invention, a nickel (Ni) top metal layer serving as a seed layer function of a conventional gold (Au) top metal layer may be removed.

Although the drawings illustrate that one circuit pattern 150 is formed on the insulating layer 110, the circuit pattern 150 may be formed on at least any one surface of upper and lower surfaces of the insulating layer 110 as multiple patterns having a regular gap.

When the circuit pattern 150 is described in more detail with reference to FIG. 4, the circuit pattern 150 includes the first circuit pattern 130 formed on the plating seed layer 120 having a lower surface in contact with an upper surface of the plating seed layer 120 and the second circuit pattern 140 formed on the first circuit pattern 130 and having at least a part of an upper surface in contact with the lower surface of the top metal layer 160.

Here, although it has been described that the circuit pattern 150 is provided with the first circuit pattern 130 and the second circuit pattern 140 as a plurality of layers, since the first circuit pattern 130 and the second circuit pattern 140 are formed of the same material, the first circuit pattern 130 and the second circuit pattern 140 are substantially formed as a single layer.

A lower surface of the first circuit pattern 130 of the circuit pattern 150 is formed being in direct contact with the upper surface of the plating seed layer 120.

At this point, corner portions of an upper portion of the first circuit pattern 130 of the circuit pattern 150 are formed to have a predetermined curvature in a lengthwise direction. Preferably, the corner portions of the first circuit pattern 130 are formed to have a convex curvature in the lengthwise direction.

The corner portions are boundary portions of upper and side surfaces of the first circuit pattern 130 and thus include a part of the upper surface and a part of the side surface.

Further, the second circuit pattern 140 of the circuit pattern 150 is formed on the first circuit pattern 130 and covers the corner portions of the first circuit pattern 130.

That is, the lower surface of the second circuit pattern 140 of the circuit pattern 150 is formed to have a predetermined curvature corresponding to the curvature of the corner portion of the first circuit pattern 130.

Meanwhile, the circuit pattern 150 includes the first circuit pattern 130 and the second circuit pattern 140, wherein the second circuit pattern 140 is formed on the upper surface of the first circuit pattern 130 and has a predetermined height b.

Here, the predetermined height b refers to a height of the second circuit pattern 140 of the circuit pattern 150 except a filled portion of the corner portion of the first circuit pattern 130. In other words, the predetermined height b refers to a height of the second circuit pattern 140 protruding from the pure upper surface of the first circuit pattern 130 except the corner portion.

At this point, the height b of the second circuit pattern 140 may be in a range from 1 µm to 13 µm. Preferably, the height b of the second circuit pattern 140 may be in a range from 3 µm to 10 µm. More preferably, the height b of the second circuit pattern 140 may be in a range from 3 µm to 6 µm.

That is, when the height of the second circuit pattern 140 is more than 1 µm, an overspreading phenomenon of the top metal layer according to the embodiment of the present invention can be prevented. Further, when the height of the second circuit pattern 140 is in a range from 3 µm to 6 µm, the protrusion of the top metal layer 160 is minimized, and the overspreading phenomenon of the top metal layer 160 can be prevented completely.

Meanwhile, the lower surface of the top metal layer 160 includes a contact region in contact with the upper surface of the circuit pattern 150 and a non-contact region which protrudes from the contact region to the outside of the upper surface of the circuit pattern 150 and not in contact with the upper surface of the circuit pattern 150.

Here, a width of the non-contact region of the top metal layer 160 may be in a range from 3 µm to 7 µm. Preferably, the width of the non-contact region of the top metal layer 160 may be in a range from 3 µm to 4 µm.

That is, with the second circuit pattern 140 of the circuit pattern 150 not formed, when the top metal layer 160 is formed, the width of the non-contact region of the top metal layer 160 is increased compared to that of the embodiment of the present invention, and thus the width is generally in a range from 8 µm to 9 µm.

However, in the embodiment of the present invention, since the top metal layer 160 is formed after the second circuit pattern 140 of the circuit pattern 150 is formed, the width of the non-contact region of the top metal layer 160 is minimized, and thus the non-contact region has a width of 7 µm or less.

According to the embodiment of the present invention, a flash plating process is performed to fill corner portions of a circuit pattern etched during a preprocessing process, then a surface processing process is performed with the corner portions filled, and thus a failure of the top metal layer due to overspreading can be removed, thereby the reliability of a PCB can be improved.

In addition, according to the embodiment of the present invention, since a top metal layer is formed by utilizing a plating seed layer used in the formation of a circuit pattern, one of electrolytic surface processing and electroless surface processing methods is selectable without a design restriction.

Further, according to the embodiment of the present invention, since a top metal layer including gold (Au) is formed using the plating seed layer used in the formation of the circuit pattern, a nickel (Ni) top metal layer serving as a seed layer function of a conventional gold (Au) top metal layer can be removed, thus a thickness of a product can be lowered, and product cost can also be lowered due to the removal of the nickel top metal layer.

Furthermore, according to the embodiment of the present invention, since a portion, protruding from a side surface of the circuit pattern to the outside, of the top metal layer is minimized by performing the flash plating process, the structural stability of the top metal layer can be secured.

Hereinafter, a method of manufacturing the PCB according to the embodiment of the present invention shown in FIG. 3 will be described in detail with reference to FIGS. 5 to 15.

Figure 5:
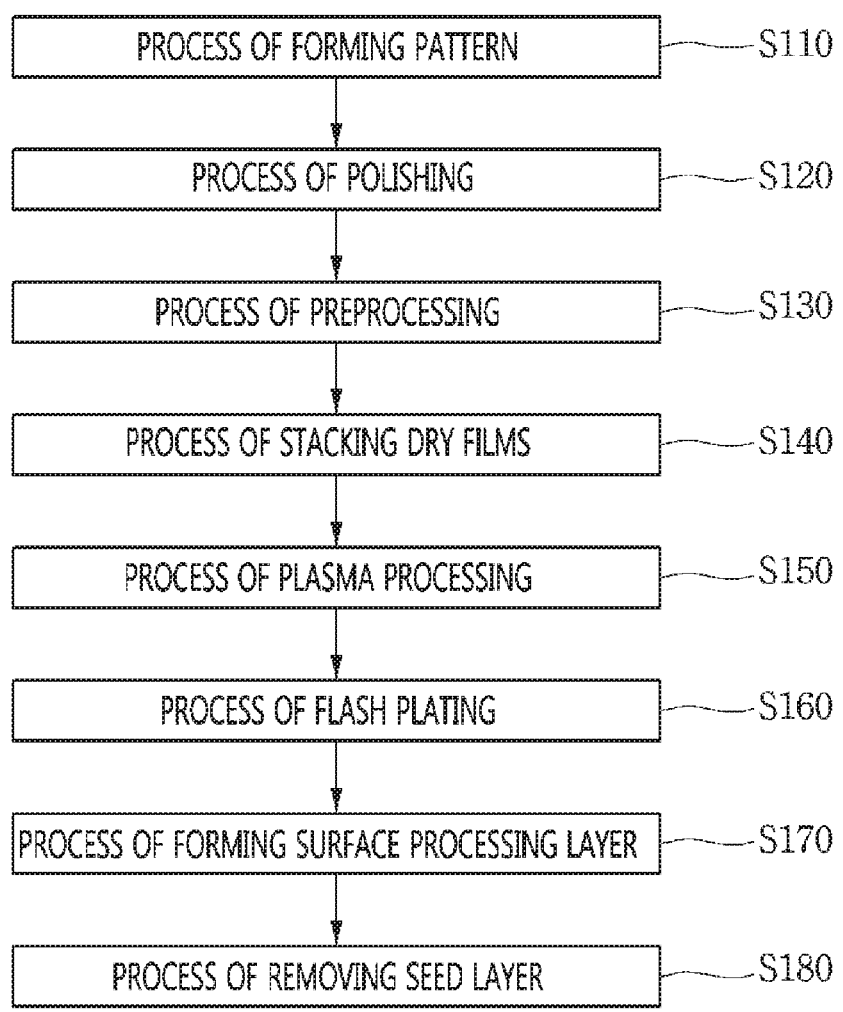
FIG. 5 is a flowchart of a process sequence for describing a method of manufacturing the PCB according to the embodiment of the present invention.

FIG. 5 is a flowchart of a process sequence for describing the method of manufacturing the PCB according to the embodiment of the present invention, and FIGS. 6 to 15 are cross-sectional views of the process sequence for describing the method of manufacturing the PCB shown in FIG. 3.

Referring to FIG. 5, the PCB according to the embodiment of the present invention may be manufactured by the following manufacturing process.

First, the manufacture the PCB according to the embodiment of the present invention starts with a process of forming a pattern using a pattern formation process (S110).

When the pattern is formed, a process of polishing a surface of the pattern is performed using a polishing process (S120).

Then, when the polishing process is performed, a part of the surface of the pattern is etched during a preprocessing process (S130).

Further, when the preprocessing process is completed, a process of stacking dry films is performed to perform flash plating and surface processing plating (S140). Here, preferably, the dry films are stacked for the surface processing plating. In other words, the flash plating may be performed after the dry films are stacked, or alternatively, the flash plating may be performed in advance before the dry films are stacked.

Then, when the dry films are stacked, a plasma processing process is performed on the surface of the formed pattern (S150).

At this point, the plasma processing process is performed selectively and is not a necessary process to be included. However, when the plasma processing process was performed, a width or shape of a non-contact region of the top metal layer 160 that was made was different and better than a width or shape made by performing the plasma processing process. Thus, in order to obtain a better result, it is preferable that the plasma processing process be performed.

When the plasma processing process is performed, a flash plating process is performed to fill corner portions of the pattern etched during the preprocessing process (S160).

Then, when the flash plating process is completed, a top metalayer is formed on a layer formed by performing the flash plating (S170).

When the top metal layer is formed, a process of removing a seed layer used for forming the top metal layer and the pattern is performed (S180).

Hereinafter, each of the above processes will be described in detail with reference to FIGS. 6 to 15.

Figure 6:
FIGS. 6 to 15 are cross-sectional views of the process sequence for describing the method of manufacturing the PCB shown in FIG. 3.

First, referring to FIG. 6, an insulating layer 110 is provided, and a plating seed layer 120 is formed on the provided insulating layer 110.

The plating seed layer 120 may be formed on the insulating layer 110 by electroless-plating of pure copper or a metal including copper.

The insulating layer 110 may be a thermosetting or thermoplastic polymer board, a ceramic board, an organic-inorganic composition material board, or a fiberglass immersion board, and when a polymer resin is included, an epoxy-based insulating resin may be included, otherwise, a polyimide-based resin may be included.

That is, the insulating layer 110 is a plate on which an electrical circuit capable of changing wirings is disposed and may include all of printing, a wiring plate, and an insulating board which are formed of an insulating material which is able to form a conductive pattern on a surface of the insulating board.

The insulating layer 110 may be rigid or flexible. For example, the insulating layer 110 may include glass or plastic. Specifically, the insulating layer 110 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

Further, the insulating layer 110 may include an optically isotropic film. For example, the insulating layer 110 may include cyclic olefin copolymer (COC), cyclic olefin polymer (COP), optically isotropic PC, optically isotropic polymethylmethacryate (PMMA), etc.

Further, the insulating layer 110 may have a curved surface which is partially bent. That is, the insulating layer 110 may partially have a plane and may partially be bent having the curved surface. Specifically, an end portion of the insulating layer 110 may be bent having the curved surface, bent having a surface with a random curvature, or crooked.

Further, the insulating layer 110 may be a flexible board having flexibility.

Further, the insulating layer 110 may be a curved or bent board. Here, the insulating layer 110 may form a wiring layout for electrical wirings which connect circuit components based on a circuit design, and electrical conductors may be disposed thereon. Further, electrical components may be mounted on the insulating layer 110, and the insulating layer 110 may form wirings configured to connect the electrical components to make a circuit, and may mechanically fix the components besides functioning as electrically connecting the components.

The plating seed layer 120 may use a general copper clad laminate (CCL) rather than being formed by electroless-plating on the surface of the insulating layer 110.

At this point, when the plating seed layer 120 is formed by electroless-plating, roughness may be introduced to the upper surface of the insulating layer 110 for performing easy plating.

An electroless-plating method may be processed by sequentially performing a degreasing process, a soft corrosion process, a preliminary catalyst processing process, a catalyst processing process, an activation process, an electroless-plating process, and an oxidation prevention processing process. Further, the plating seed layer 120 may be formed by sputtering metal particles using plasma instead of plating.

At this point, a de-smear process which removes smears of the surface of the insulating layer 110 may be additionally performed before plating the plating seed layer 120. The de-smear process is performed to make a surface of the insulating layer 110 rough to make plating easy for forming the plating seed layer 120.

Figure 7:
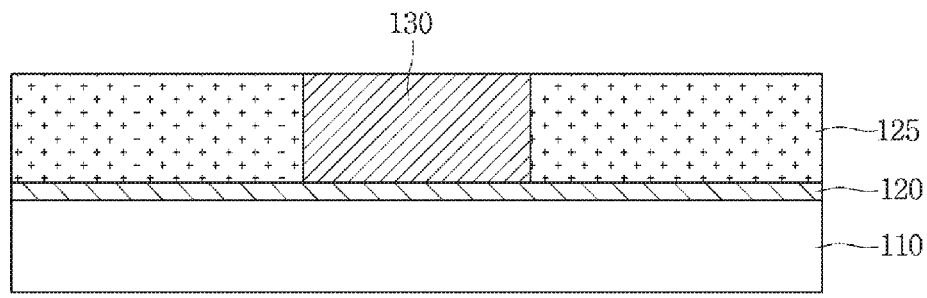

Next, referring to FIG. 7, a first mask 125 is formed on the plating seed layer 120. Here, the first mask 125 may use a dry film.

Here, the first mask 125 may include an opening (not shown) which exposes at least a part of an upper surface of the plating seed layer 120.

Here, the upper surface exposed by the opening of the first mask 125, which is a part of the upper surface of the plating seed layer 120, corresponds to a region in which a circuit pattern 150 may be formed later.

In other words, the first mask 125 having the opening which exposes a portion of the upper surface of the plating seed layer 120 for forming the circuit pattern 150 is formed on the plating seed layer 120.

At this point, the first mask 125 may be formed to cover the entire upper surface of the plating seed layer 120, and thus the opening may be formed by removing a part of a portion, in which the circuit pattern 150 may be formed, of the formed first mask 125.

Next, the circuit pattern 150 under which the opening of the first mask 125 is buried is formed on the plating seed layer 120. Preferably, a first circuit pattern 130 of the circuit pattern 150 under which at least a part of the opening of the first mask 125 is buried is formed on the plating seed layer 120.

The first circuit pattern 130 of the circuit pattern 150 may be formed by electroplating a conductive material, e.g., preferably, an alloy including copper, on the plating seed layer 120 as a seed layer to bury at least a part of the opening of the first mask 125.

Figure 8:
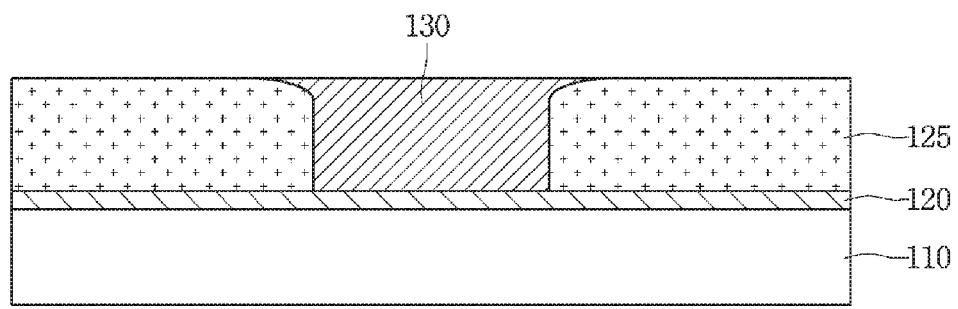

Then, referring to FIG. 8, when the first circuit pattern 130 of the circuit pattern 150 is formed, a grinding process for planarization of an upper surface of the first circuit pattern 130 of the formed circuit pattern 150 is performed.

While performing the grinding process, at least a part of the upper portion of the first circuit pattern 130 of the circuit pattern 150 spreads into the first mask 125, and thus an upper end portion of the first circuit pattern 130 includes a protrusion (not shown) protruding in a direction of the first mask 125.

Figure 9:
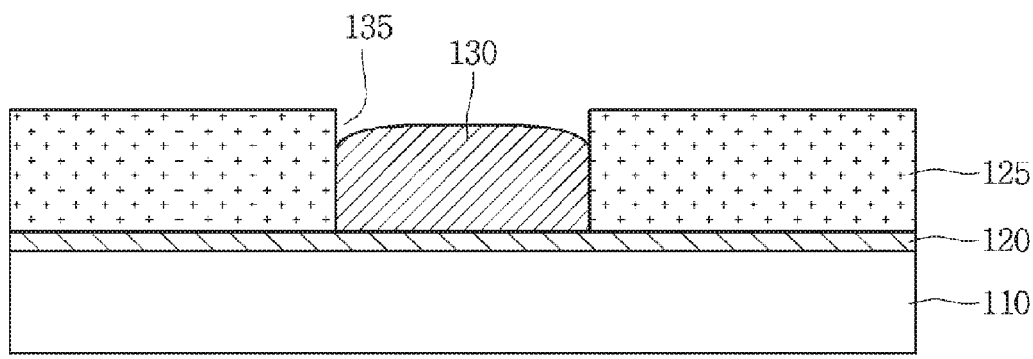

Then, referring to FIG. 9, a preprocessing process for performing a surface processing process is performed.

Here, the preprocessing process is performed using an acid-based chemical for etching a surface of first circuit pattern 130 of the circuit pattern 150. At this point, when the preprocessing process is performed, the etching is performed not only on the upper surface of the first circuit pattern 130 but also boundary surfaces of upper and side surfaces of the first circuit pattern 130.

Thus, when the preprocessing process is performed, a corner portion 135 of the first circuit pattern 130 has a predetermined curvature in a convex shape.

Here, the preprocessing process etches the surface of the first circuit pattern 130, and at this point, the etching is preferably performed in a range from 0.4 µm to 10 µm.

In other words, when the preprocessing process is performed, a gap is generated between the first mask 125 and first circuit pattern 130 of the circuit pattern.

Figure 10:
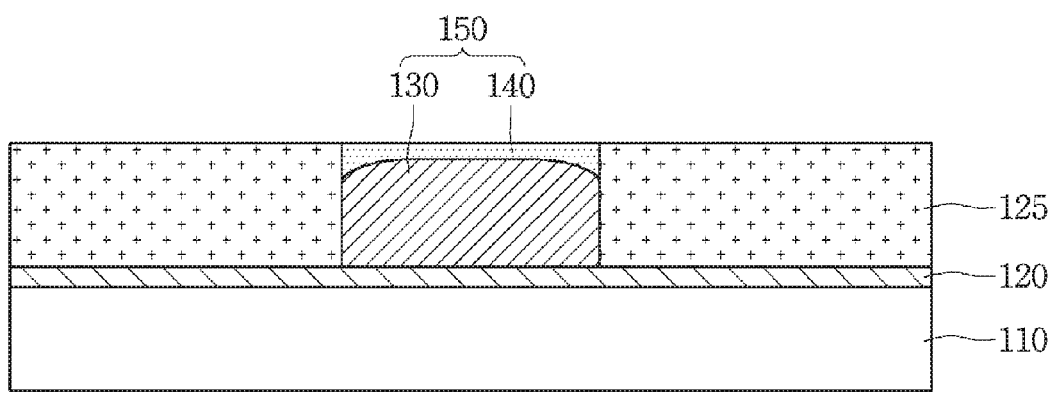

Then, referring to FIG. 10, a flash plating process is performed to form a second circuit pattern 140 of the circuit pattern 150 on the first circuit pattern 130.

Here, the circuit pattern 150 includes the first circuit pattern 130 in which a corner portion of an upper portion has a predetermined curvature, and the second circuit pattern 140 which is formed on the first circuit pattern 130 and covers the corner portion of the first circuit pattern 130.

That is, the circuit pattern 150 includes the first circuit pattern 130 in which boundary portions of the upper and side surfaces have convexly curved surfaces by having the corner portions removed during the preprocessing process.

Further, the second circuit pattern 140 is disposed on the first circuit pattern 130.

The second circuit pattern 140 is formed to cover the convexly curved surface of the first circuit pattern 130. In other words, the second circuit pattern 140 fills the corner portions of the first circuit pattern 130 removed during the preprocessing process.

An upper surface of the second circuit pattern 140 may be planar, and a lower surface thereof may have a curvature corresponding to a curvature of the corner portion of the first circuit pattern 130.

At least a part of a lower end of the second circuit pattern 140 is positioned at a lower level than an upper end of the first circuit pattern 130.

That is, the second circuit pattern 140 is formed to cover the corner portions of the first circuit pattern 130, and the corner portions are boundary surfaces of the upper and side surfaces of the first circuit pattern 130. In other words, the corner portions of the first circuit pattern 130 include a part of upper surface and a part of side surfaces of the first circuit pattern 130.

Accordingly, the second circuit pattern 140 is formed to substantially cover a part of the upper and side surfaces of the first circuit pattern 130.

Thus, a part of the lower end of the second circuit pattern 140 extends up to a side surface portion of the first circuit pattern 130 and is thus positioned at a lower level than the upper end of the first circuit pattern 130.

Here, although it has been described that the circuit pattern 150 is provided with the first circuit pattern 130 and the second circuit pattern 140 as a plurality of layers, since the first circuit pattern 130 and the second circuit pattern 140 are formed of the same material, the first circuit pattern 130 and the second circuit pattern 140 are substantially formed as a single layer.

A lower surface of the first circuit pattern 130 of the circuit pattern 150 is formed being in direct contact with the upper surface of the plating seed layer 120.

At this point, corner portions of an upper portion of the first circuit pattern 130 of the circuit pattern 150 are formed to have a predetermined curvature in a lengthwise direction. Preferably, the corner portions of the first circuit pattern 130 are formed to have a convex curvature in the lengthwise direction.

The corner portions are boundary portions of upper and side surfaces of the first circuit pattern 130 and thus include a part of the upper surface and a part of the side surface.

Further, the second circuit pattern 140 of the circuit pattern 150 is formed on the first circuit pattern 130 and covers the corner portions of the first circuit pattern 130.

That is, the lower surface of the second circuit pattern 140 of the circuit pattern 150 is formed to have a predetermined curvature corresponding to a curvature of the corner portion of the first circuit pattern 130.

Meanwhile, the circuit pattern 150 includes the first circuit pattern 130 and the second circuit pattern 140, wherein the second circuit pattern 140 is formed on the upper surface of the first circuit pattern 130 and has a predetermined height b.

Here, the predetermined height b refers to a height of the second circuit pattern 140 of the circuit pattern 150 except a filled portion of the corner portion of the first circuit pattern 130. In other words, the predetermined height b refers to a height of the second circuit pattern 140 protruding from the pure upper surface of the first circuit pattern 130 except the corner portion.

At this point, the height b of the second circuit pattern 140 may be in a range from 1 μm to 13 μm. Preferably, the height b of the second circuit pattern 140 may be in a range from 3 μm to 10 μm. More preferably, the height b of the second circuit pattern 140 may be in a range from 3 μm to 6 μm.

That is, when the height of the second circuit pattern 140 is more than 1 μm, an overspreading phenomenon of the top metal layer according to the embodiment of the present invention can be prevented. Further, when the height of the second circuit pattern 140 is in a range from 3 μm to 6 μm, the protrusion of the top metal layer 160 is minimized and the overspreading phenomenon of the top metal layer 160 can be prevented completely.

Figure 11:
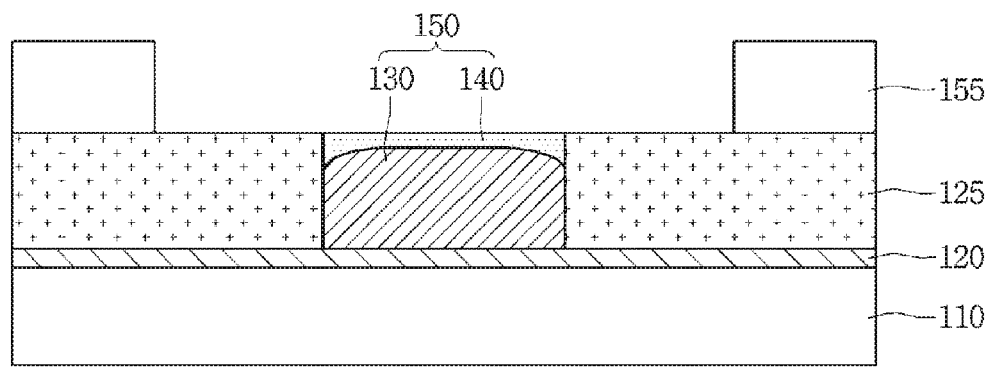

Then, referring to FIG. 11, a second mask 155 having an opening which exposes an upper surface of the circuit pattern 150, i.e., specifically, the upper surface of the second circuit pattern 140, is formed on the first mask 125.

The second mask 155 may include a dry film similar to the first mask 125.

Figure 12:
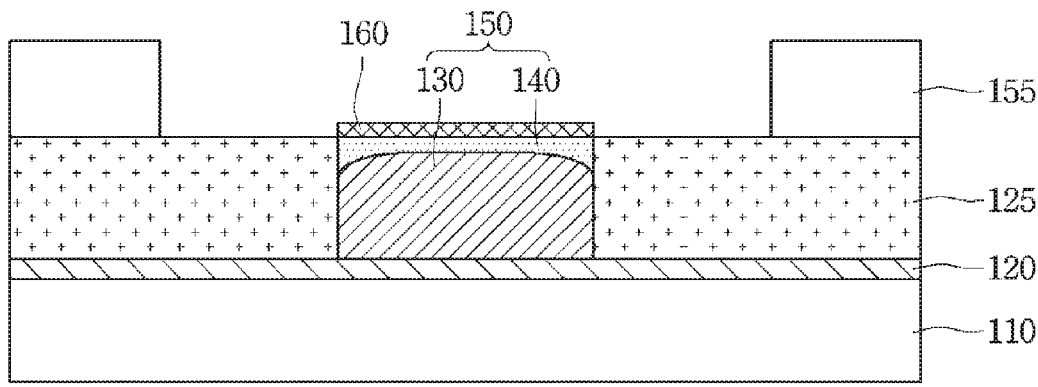

Then, referring to FIG. 12, by using the plating seed layer 120 and the circuit pattern 150 as seed layers, the top metal layer 160 is formed on the circuit pattern 150.

The top metal layer 160 is formed to have the same width as a width of the opening of the second mask 155.

The top metal layer 160 may be formed of a metal including only gold (Au) or may be formed of an alloy including gold (Au).

When the top metal layer 160 is formed of the alloy including gold (Au), the top metal layer 160 may be formed of a gold alloy including cobalt. At this point, the top metal layer 160 is formed by electroplating.

Preferably, the top metal layer 160 is formed by electroplating on the plating seed layer 120 which is the same layer as the plating seed layer used in the formation of the circuit pattern 150. That is, the electroplating for the top metal layer 160 is performed due to an electrical connection resulting from the connection between the plating seed layer 120 and the circuit pattern 150.

The top metal layer 160 is formed on the circuit pattern 150, and thus a lower surface of the top metal layer 160 is in direct contact with the upper surface of the circuit pattern 150.

Figure 13:
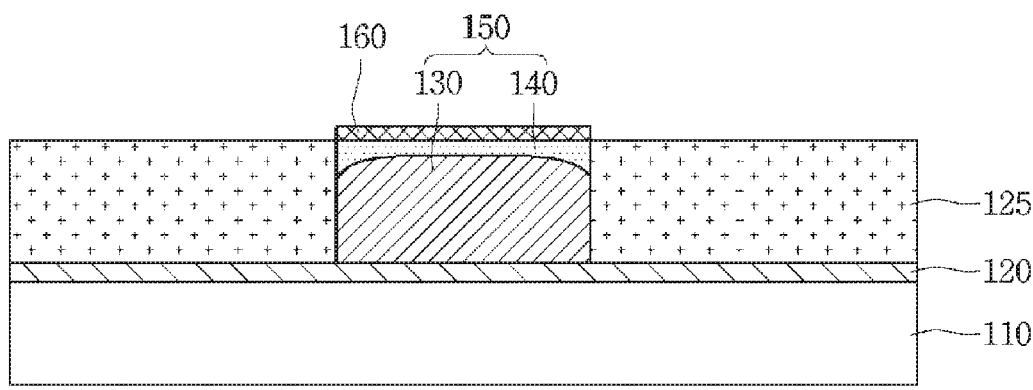

Then, referring to FIG. 13, when the top metal layer 160 is formed, the second mask 155 used for forming the top metal layer 160 is removed.

Figure 14:
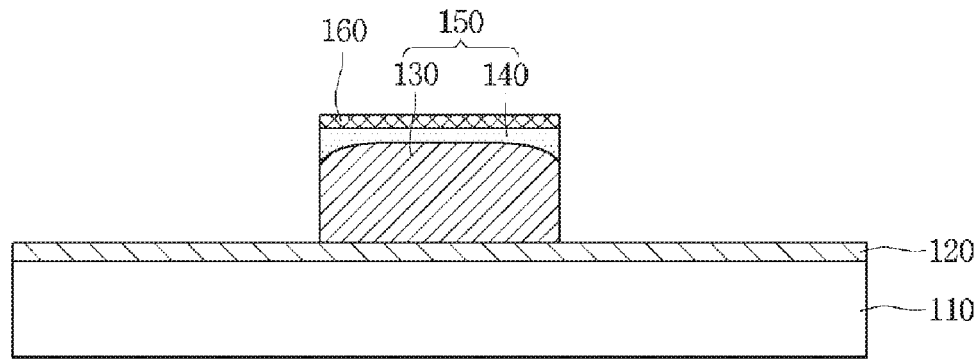

Then, referring to FIG. 14, when the second mask 155 is removed, the first mask 125 used for forming the circuit pattern 150 is removed.

Figure 15:
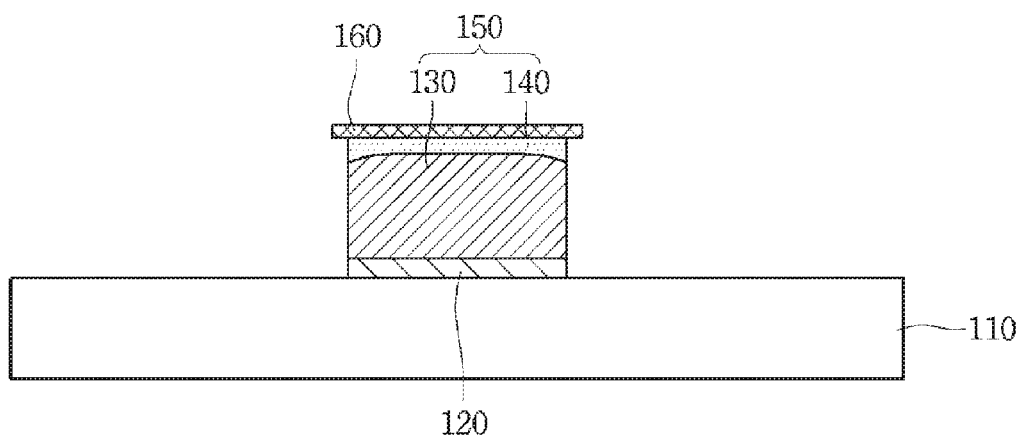

When the first mask 125 is removed, as shown in FIG. 15, a process of removing the plating seed layer 120 formed on the insulating layer 110 is performed. At this point, while performing the process of removing the plating seed layer 120, a portion, formed under the circuit pattern 150, of the plating seed layer 120 is not removed due to the circuit pattern 150, instead only a portion on which the circuit pattern 150 is not formed is removed selectively.

At this point, an edge portion of the circuit pattern 150 is also removed during the process of removing the plating seed layer 120.

That is, at least a part of side portions of the circuit pattern 150 is removed together with the plating seed layer 120 while removing the plating seed layer 120.

Accordingly, the circuit pattern 150 may have a smaller width than the top metal layer 160, and the top metal layer 160 protrudes from a side surface of the circuit pattern 150 to the outside.

The top metal layer 160 is formed on the circuit pattern 150, and thus the lower surface of the top metal layer 160 is in direct contact with the upper surface of the circuit pattern 150. More specifically, the lower surface of the top metal layer 160 is in direct contact with the upper surface of the second circuit pattern 140 of the circuit pattern 150.

Here, the top metal layer 160 includes a lower surface having a width greater than a width of the upper surface of the circuit pattern 150.

Accordingly, the lower surface of the top metal layer 160 includes a first lower surface in direct contact with the upper surface of the circuit pattern 150 and a second lower surface not in contact with the upper surface of the circuit pattern 150.

Here, the first lower surface of the top metal layer 160 may be a central region of the lower surface of the top metal layer 160, and the second lower surface of the top metal layer 160 may be left and right regions of the top metal layer 160.

Further, the top metal layer 160 may have a shape in which widths of upper and lower surfaces are the same.

Meanwhile, the upper and lower surfaces of the top metal layer 160 may have widths greater than that of the lower surface of the circuit pattern 150.

Meanwhile, the lower surface of the top metal layer 160 includes a contact region in contact with the upper surface of the circuit pattern 150 and a non-contact region not in contact with the upper surface of the circuit pattern 150 by protruding from the contact region to the outside of the upper surface of the circuit pattern 150.

Here, a width of the non-contact region of the top metal layer 160 may be in a range from 3 µm to 7 µm. Preferably, the width of the non-contact region of the top metal layer 160 may be in a range from 3 µm to 4 µm.

That is, with the second circuit pattern 140 of the circuit pattern 150 not formed, when the top metal layer 160 is formed, the width of the non-contact region of the top metal layer 160 is increased compared to that of the embodiment of the present invention, and thus the width is generally in a range from 8 µm to 9 µm.

However, in the embodiment of the present invention, since the top metal layer 160 is formed after the second circuit pattern 140 of the circuit pattern 150 is formed, the width of the non-contact region of the top metal layer 160 is minimized, and thus the non-contact region has a width of 7 µm or less.

As described above, according to the embodiment of the present invention, a flash plating process is performed to fill corner portions of a circuit pattern etched during a preprocessing process, then a surface processing process is performed with the corner portions filled, and thus a failure of the top metal layer due to overspreading can be removed, thereby the reliability of a PCB can be improved.

Further, according to the embodiment of the present invention, since a top metal layer is formed by utilizing a plating seed layer used in the formation of a circuit pattern, one of electrolytic surface processing and electroless surface processing methods is selectable without a design restriction.

Further, according to the embodiment of the present invention, since a top metal layer including gold (Au) is formed using the plating seed layer used in the formation of the circuit pattern, a nickel (Ni) top metal layer serving as a seed layer function of a conventional gold (Au) top metal layer can be removed, and thus a thickness of a product can be lowered, and product cost can also be lowered due to the removal of the nickel top metal layer.

Further, according to the embodiment of the present invention, since a portion, protruding from a side surface of the circuit pattern to the outside, of the top metal layer is minimized by performing the flash plating process, the structurally stability of the top metal layer can be secured.

As described above, the object, constitution, and effects described in the embodiments are included at least one embodiment but are not necessarily limited to one embodiment. Furthermore, the object, constitution, and effects described in each embodiment can be easily modified into other concrete forms by one skilled in the art without changing the technical spirit or the essential features of the present invention. Therefore, it should be understood that all modified or changed forms derived from claims and their equivalents fall within the scope of the present invention.

Although the embodiments have been described based on a number of illustrative embodiments thereof, it should be understood that numerous other modifications and embodiments can be devised that fall within the spirit and scope of the principles of this disclosure by those skilled in the art. More particularly, numerous variations and modifications are possible in the component parts and/or arrangements of the subject combination arrangement within the scope of the disclosure, the drawings, and the appended claims.

What is claimed is:

1. A printed circuit board comprising:
   an insulating layer;
   a plating seed layer disposed on the insulating layer and formed of copper (Cu);
   a circuit pattern disposed on the plating seed layer; and
   a top metal layer disposed on the circuit pattern,
   wherein the circuit pattern comprises:
   a first circuit pattern disposed on the plating seed layer and formed of copper (Cu), and
   a second circuit pattern disposed on the first circuit pattern and formed of copper (Cu),
   wherein a thickness of the second circuit pattern is thinner than a thickness of the first circuit pattern,
   wherein the top metal layer is formed of gold (Au),
   wherein a width of a lower surface of the top metal layer is wider than a width of an upper surface of the second circuit pattern,
   wherein a first part of a lower surface of the second circuit pattern is positioned at a lower level than a first part of an upper surface of the first circuit pattern,
   wherein the first part of the lower surface of the second circuit pattern is in direct physical contact with the first circuit pattern, and
   wherein the lower surface of the top metal layer comprises: a first portion in contact with the upper surface of the second circuit pattern; and a second portion spaced apart from the plating seed layer, the first circuit pattern, and the second circuit pattern by respective predetermined distances.

2. The printed board of claim 1, wherein a length of the second portion of the top metal layer is in a range from 3 µm to 7 µm.

3. The printed board of claim 1, wherein the lower surface of the top metal layer has a wider width than a width of the plating seed layer.

4. The printed board of claim 1, wherein the lower surface of the top metal layer has a wider width than a width of the first circuit pattern.

5. The printed board of claim 1, wherein a thickness of the second circuit pattern is in a range from 1 µm to 13 µm.

6. The printed board of claim 1, wherein a thickness of the second circuit pattern is in a range from 3 µm to 10 µm.

7. The printed board of claim 1, wherein a thickness of the second circuit pattern is in a range from 3 µm to 6 µm.

8. The printed board of claim 1, wherein a lower surface of the second circuit pattern has a longer length than a lower surface of the plating seed layer.

9. A printed circuit board comprising:
   an insulating layer,
   a plating seed layer disposed on the insulating layer;

a first circuit pattern disposed on the plating seed layer and directly contacted with the plating seed layer;

a second circuit pattern directly contacted with the first circuit pattern and formed of copper; and a top metal layer directly contacted with the second circuit pattern and formed of gold (Au), wherein the top metal layer has a wider width than a width of the second circuit pattern, wherein the plating seed layer and the first circuit pattern are formed of copper (Cu), wherein a thickness of the second circuit pattern is thinner than a thickness of the first circuit pattern, wherein a first part of a lower surface of the second circuit pattern is positioned at a lower level than a first part of an upper surface of the first circuit pattern, wherein the first part of the lower surface of the second circuit pattern is in direct physical contact with the first circuit pattern, and wherein the lower surface of the top metal layer comprises: a first portion in contact with the upper surface of the second circuit pattern; and a second portion spaced apart from the plating seed layer, the first circuit pattern, and the second circuit pattern by respective predetermined distances.

10. The printed board of claim 9, wherein a length of the second portion of the top metal layer is in a range from 3 μm to 7 μm.

11. The printed board of claim 9, wherein a width of a lower surface of the top metal layer is wider than a width of an upper surface of the second circuit pattern.

12. The printed board of claim 9, wherein a thickness of the second circuit pattern is in a range from 1 μm to 13 μm.

13. The printed board of claim 9, wherein a plurality of the first circuit patterns are disposed on the plating seed layer, and a plurality of the second circuit patterns are disposed on the plurality of the first circuit patterns.

14. The printed board of claim 9, wherein roughness is introduced to an upper surface of the insulating layer.

15. The printed board of claim 9, wherein the insulating layer includes at least one of a thermosetting polymer, a thermoplastic polymer, a ceramic, an organic-inorganic composition material, a fiberglass immersion, an epoxy-based insulating resin, and a polyimide-based resin.

* * * * *